United States Patent
Rosseinsky et al.

(10) Patent No.: US 10,689,297 B2
(45) Date of Patent: Jun. 23, 2020

(54) MULTIFERROIC MATERIALS

(71) Applicant: The University of Liverpool, Liverpool (GB)

(72) Inventors: Matthew J. Rosseinsky, Liverpool (GB); Pranab Mandal, Liverpool (GB); Jonathan Alaria, Liverpool (GB); John Claridge, Liverpool (GB); Michael Pitcher, Liverpool (GB)

(73) Assignee: THE UNIVERSITY OF LIVERPOOL, Liverpool (GB)

( * ) Notice: Subject to any disclaimer, the term of this patent is extended or adjusted under 35 U.S.C. 154(b) by 275 days.

(21) Appl. No.: 15/558,424

(22) PCT Filed: Mar. 16, 2016

(86) PCT No.: PCT/GB2016/050715
§ 371 (c)(1),
(2) Date: Sep. 14, 2017

(87) PCT Pub. No.: WO2016/147000
PCT Pub. Date: Sep. 22, 2016

(65) Prior Publication Data
US 2018/0057409 A1   Mar. 1, 2018

(30) Foreign Application Priority Data
Mar. 16, 2015  (GB) .................................. 1504418.3

(51) Int. Cl.
| | | |
|---|---|---|
| C04B 35/26 | (2006.01) | |
| H01F 1/40 | (2006.01) | |
| H01F 10/193 | (2006.01) | |
| C04B 35/622 | (2006.01) | |
| C04B 35/626 | (2006.01) | |
| C04B 35/634 | (2006.01) | |
| C04B 35/64 | (2006.01) | |
| H01L 27/11507 | (2017.01) | |
| H01L 27/22 | (2006.01) | |
| H01L 49/02 | (2006.01) | |
| H01L 43/08 | (2006.01) | |
| H01L 43/10 | (2006.01) | |
| H01L 43/12 | (2006.01) | |

(52) U.S. Cl.
CPC ...... *C04B 35/2683* (2013.01); *C04B 35/6261* (2013.01); *C04B 35/6264* (2013.01); *C04B 35/62218* (2013.01); *C04B 35/62695* (2013.01); *C04B 35/6342* (2013.01); *C04B 35/64* (2013.01); *H01F 1/407* (2013.01); *H01F 10/1933* (2013.01); *H01L 27/11507* (2013.01); *H01L 27/222* (2013.01); *H01L 28/55* (2013.01); *H01L 43/08* (2013.01); *H01L 43/10* (2013.01); *H01L 43/12* (2013.01); *C04B 2235/3206* (2013.01); *C04B 2235/3208* (2013.01); *C04B 2235/3236* (2013.01); *C04B 2235/3274* (2013.01); *C04B 2235/3298* (2013.01); *C04B 2235/85* (2013.01)

(58) Field of Classification Search
CPC ................ C04B 35/2683; C04B 35/49; C04B 35/62218; C04B 35/622; C04B 35/62695; C04B 35/6264; C04B 35/6261; C04B 35/6342; C04B 35/64
See application file for complete search history.

(56) References Cited

U.S. PATENT DOCUMENTS

| | | | | |
|---|---|---|---|---|
| 6,093,338 | A | 7/2000 | Tani et al. | |
| 8,179,025 | B1 | 5/2012 | Takeuchi et al. | |
| 8,591,987 | B2 * | 11/2013 | Pirich | B82Y 40/00 427/240 |
| 8,597,533 | B2 * | 12/2013 | Kim | C01G 49/0018 252/62.58 |
| 8,803,264 | B1 * | 8/2014 | Katiyar | H01L 29/516 257/421 |
| 2012/0177902 | A1 * | 7/2012 | Driscoll | C01G 49/009 428/216 |

FOREIGN PATENT DOCUMENTS

| | | | |
|---|---|---|---|
| CN | 103030386 | * | 4/2013 |
| CN | 103224392 | A | 7/2013 |
| CN | 103265281 | A | 8/2013 |
| CN | 103779395 | A | 5/2014 |
| CN | 103833353 | * | 6/2014 |
| GB | 2503435 | A | 1/2014 |

OTHER PUBLICATIONS

Translation of CN 103030386, Apr. 10, 2013.*
Translation of CN 103833353, Jun. 4, 2014.*
Rai et al, "Multiferroic propeties of BiFeO3 doped Bi(MgTi)O3-PbTiO3 ceramic system", Journal of Alloys and Compounds, 506, Jul. 2010, pp. 815-819.*
Li et al,"Structure and multiferroic propeties of Bi1-xDyxFe0.9Mg0.05Ti0.05O3 soldi solution", Journal of Applied Physics, 113, Feb. 2013, 054102-1 to 054102-6.*
Chen et al., "Effects of la concentration on the structural and dielectric properties of 0.57 BiFeO/sub 3/-0.43 PbTiO/sub 3/crystalline solutions," Appl of Ferroelec, pp. 418-420 (2007).
International Search Report and Written Opinion for International Application No. PCT/GB2016/050715 dated Jul. 19, 2016.

(Continued)

*Primary Examiner* — C Melissa Koslow
(74) *Attorney, Agent, or Firm* — Foley Hoag LLP; David P. Halstead

(57) ABSTRACT

The present invention relates to new multiferroic materials. More particularly, the present invention relates to new multiferroic single phase ceramic materials as well as to thin films formed from these materials, methods of preparing these materials and their use as multiferroic materials in electronic components and devices.

19 Claims, 6 Drawing Sheets

(56) References Cited

OTHER PUBLICATIONS

Mandal et al., "Designing switchable polarization and magnetization at room temperature in an oxide," Nature, 525(7569):363-366 (2015).

Mandal et al., "Morphotropic Phase Boundary in the Pb-Free (1-x)BiTi(3/8)Fe(2/8)Mg(3/8)O□-xCaTiO□ System: Tetragonal Polarization and Enhanced Electromechanical Properties," Adv Mater, 27(18):2883-2889 (2015).

Search Report issued by Intellectual Property Office in corresponding Application No. GB1504418.3, dated Jul. 30, 2015.

Zhuang et al., "Local polar structure and multiferroic properties of (1-x) Bi0. 9Dy0. 1FeO3-x PbTiO3 solid solution," J Appl Phys, 116(6):066809 (2014).

Bibes et al., "Towards a magnetoelectric memory," *Nat Mater*, 7:425-426 (2008).

Borisov et al., "Superconducting quantum interference device setup for magnetoelectric measurements," Rev. Sci. Instrum., 78(106105):1-3 (2007).

Chappert et al., "The emergence of spin electronics in data storage," Nature Materials, 6:813-823 (2007).

Eerenstein et al., "Multiferroic and magnetoelectric materials," Nature, 442(17):759-765 (2006).

Fiebig, "Revival of the magnetoelectric effect," Journal of Physics D: Applied Physics, 38:R123-R152 (2005).

Garcia et al., "Inside story of ferroelectric memories," *Nature*, 483:279-281 (2012).

Hill, "Why Are There so Few Magnetic Ferroelectrics?" The Journal of Physical Chemistry B, 104:6694-6709 (2000).

Kamenetskii et al., "Magnetoelectric Effect for Novel Microwave Device Applications," Electrical and Electronics Engineers in Israel, IEEE 25th Convention, 599-603 (2008).

Kita et al., "Low?temperature phase of yttrium iron garnet (YIG) and its first?order magnetoelectric effect," Journal of Applied Physics, 64(10):5659-5661 (1988).

Nan et al., "Self-Biased 215MHz Magnetoelectric NEMS Resonator for Ultra-Sensitive DC Magnetic Field Detection," Sci. Rep. 3(1985):1-6 (2013).

Rivera et al., "Linear and quadratic magnetoelectric (ME) effect in Ni?Cl boracite," Journal of Applied Physics, 70(10):6410-6412 (1991).

Rivera, "A shod review of the magnetoelectric effect and related experimental techniques on single phase (multi-) ferroics," Eur. Phys. J. B, 71:299-313 (2009).

Ryu et al., "Magnetoelectric Effect in Composites of Magnetostrictive and Piezoelectric Materials," Journal of Electroceramics, 8:107-119 (2002).

Schmid, "Some symmetry aspects of ferroics and single phase multiferroics," J. Phys. Cond. Matter, 20(434201):1-24 (2008).

Scott et al., "Ferroelectric Memories," *Science*, 246:1400-1405 (1989).

Scott, "Data storage: Multiferroic memories," Nat Mater, 6:256-257 (2007).

Scott, "Room-temperature multiferroic magnetoelectrics," NPG Asia Mater, 5(e72):1-11 (2013).

Zhai et al., "Detection of pico-Tesla magnetic fields using magnetoelectric sensors at room temperature," *Applied Physics Letters* 88(062510):1-3 (2006).

Zhu, "Magnetoresistive Random Access Memory: The Path to Competitiveness and Scalability," *Proceedings of the IEEE*, 96(11):1786-1798 (2008).

\* cited by examiner

MULTIFERROIC MATERIALS

RELATED APPLICATIONS

This application is a § 371 national stage application based on Patent Cooperation Treaty Application serial number PCT/GB2016/050715, filed Mar. 16, 2016; which claims the benefit of priority to GB 1504418.3, filed Mar. 16, 2015.

INTRODUCTION

The present invention relates to new multiferroic materials. More particularly, the present invention relates to new multiferroic single phase ceramic materials as well as to thin films formed from these materials, methods of preparing these materials and their use as multiferroic materials in electronic components and devices.

BACKGROUND OF THE INVENTION

Ferroelectrics (FE) are electrically polarisable materials which possess spontaneous polarisation below the Curie temperature ($T_{CE}$), and the polarisation in ferroelectric materials is switchable with respect to an external electric field. Similarly, ferromagnets have induced magnetisation below the Curie temperature ($T_{CE}$) and the magnetisation in ferromagnetic materials is switchable with respect to an external magnetic field.

The field-driven switching of the ferroelectric and ferromagnetic properties forms the basis of ferroelectric random access memory (FERAM) and magnetic random access memory (MRAM) devices respectively [1-3]. Both devices are non-volatile and have certain advantages over conventional random access memory devices (RAMs).

FERAMs offers faster writing performance over conventional RAMs, whilst MRAMs offers non-destructive magnetic reading [4].

The full scale commercialisation of FERAMs and MRAMs, however, has been constrained by certain drawbacks suffered by these devices. FERAMs suffer from low storage densities, whereas MRAMs suffer from high writing energy consumption [4].

Materials that exhibit both a magnetisation and a dielectric polarisation in a single phase are referred to as multiferroic or magnetoelectric materials.

The induction of magnetic moment by an external electric field or polarisation by a magnetic field is known as the magnetoelectric effect and is a property of multiferroic materials. The use of the magnetoelectric effect has been proposed in many applications, such as magnetic field sensors [5,6], magnetoelectric MRAM (ME-MRAM) [7] and microwave devices [8].

Ferroelectricity and ferromagnetism (or antiferromagnetism) have different electronic structure requirements and normally do not coexist in single phase materials. Conventional mechanisms for ferroelectricity involve closed-shell $d^0$ or $s^2$ cations, whereas ferromagnetic order requires open-shell $d^n$ configurations with unpaired electrons [9]. This fundamental distinction has made it difficult to combine long-range order of the two dipoles to simultaneously break space inversion and time-reversal symmetry at room temperature [10].

However, there are design routes which can produce both orders in single phase materials such as the $ABO_3$ perovskite $BiFeO_3$. However, $BiFeO_3$ is known to inhibit weak ferromagnetism and linear magnetoelectric coupling due to the cycloidal magnetic ordering, and consequently is not commercially useful.

In a multiferroic material with strong magnetoelectric coupling, the polarisation or magnetisation will be switchable with respect to magnetic field or electric field. Therefore, the shortcomings in FERAMs and MRAMs could be avoided by employing suitable multiferroic materials, such that low energy ferroelectric writing and non-destructive magnetic reading could be achieved [11].

Unfortunately, at present there has been no single phase bulk material reported that demonstrates long-range ordered switchable polarisation and magnetisation at room temperature.[12]

There therefore remains a need for new and improved single phase materials that exhibit improved magnetoelectric properties.

In particular, there is a need for new and improved single phase materials that exhibit a magnetoelectric effect over the typical operational temperature ranges of electronic devices (e.g. at room temperature).

In addition, there is a need for materials that can easily be formed into multiferroic thin films using thin-film deposition techniques known in the art. Such thin films can be incorporated into a wide variety of electronic components, such as, for example, MRAM, FERAM or MERAM components.

The present invention was devised with the foregoing in mind.

SUMMARY OF THE INVENTION

Obtaining a material that is a ferroelectric ferromagnetic magnetoelectric multiferroic, which exhibits multiferroic properties over a viable operational temperature range (e.g. at room temperature or even a temperature range of from 0 to 200° C. or −40 to 200° C.) is a significant challenge. In order to achieve this, it is necessary, at the desired temperature (e.g. room temperature), to retain electrical insulating properties within the material that allow the application of an electric field sufficient to switch the electrical polarisation in the presence of the open-shell cations required for magnetism.

The inventors have surprisingly found that multiferroic materials can be formed in a single phase ceramic material comprising a morphotropic phase boundary and a continuous percolating network of magnetic cations. The morphotropic phase boundary between two polar phases with different electrical polarisation directions is well-established in ceramic material science field as leading to excellent ferroelectric switching properties, as for example in $PbZr_{1-x}Ti_xO_3$ (PZT). However, the use of a morphotropic phase boundary as a scaffold upon which to provide a continuous percolating network of magnetic cations represents a novel design approach for multiferroic materials. The inventors have found that, by utilising this design approach, single phase ceramic materials exhibiting multiferroic properties at typical operational temperatures (e.g. at room temperature) can be formed.

Thus, according to a first aspect of the present invention there is provided a single phase ceramic material comprising a morphotropic phase boundary and a continuous percolating network of magnetic cations.

In a particular aspect of the present invention there is provided a single phase ceramic material of formula (I) shown below:

$$(1-x)LM^a_{(1-y)/2}Fe_yMg_{(1-y)/2}O_3\text{-}xQ \quad\quad (I)$$

wherein:
x is a value ranging from 0.01 to 0.4;
y is a value ranging from 0.01 to 0.9;
L is selected from Bi, La, Ce, Pr, Nd, Pm, Sm, Eu, Gd, Tb, Dy, Ho, Er, Tm, Yb, Lu or Y;
$M^a$ is selected from Ti or Hf or Zr; and
Q is:
(i) a group of formula:

$RM^bO_3$ wherein:
   R is selected from Ca, Sr or Ba; and
   $M^b$ is selected from Ti, Hf or Zr; or
(ii) a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $PbZr_{1-p}Ti_pO_3$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
p is a value ranging from 0 to 1;
q is a value ranging from 0 to 1;
r is a value ranging from 0 to 1;
$M^c$ is selected from Mg, Ni, Cu, Mn, Co, Fe or Zn;
$M^d$ is selected from Fe, Mn, Cr; and
$M^e$ and $M^f$ are independently selected from one or more of the following Zn, Ti, Sn, Mg, Nb, Ta, W, Li, Ni, Cu, Fe, Cr or Mn.

In a further aspect, the present invention provides a single phase ceramic material comprising:
(i) a single phase ceramic material of formula I as defined herein; and
(ii) a further material, optionally selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $PbZr_{1-p}Ti_pO_3$, $LnScO_3$, $LnGaO_3$ or $Ln_2TiM^cO_6$;
   wherein Ln, p, q, r, $M^c$, $M^d$, $M^e$ and $M^f$ are each as defined herein.

In another aspect, the present invention provides a process for the preparation of a single phase ceramic material as defined herein, said process comprising forming a single phase ceramic material comprising a morphotropic phase boundary in the presence of a material capable of forming a continuous percolating network of magnetic cations within the morphotropic phase boundary of the ceramic material.

In a particular aspect, the present invention provides a process for forming a single phase ceramic material of formula (I) defined herein, the process comprising:
(i) combining and milling (e.g. ball milling) materials of the formulae A to E shown below:

| | |
|---|---|
| $L_2O_3$ | Formula A |
| $RCO_3$ | Formula B |
| $Fe_2O_3$ | Formula C |
| $M^aO_2$ | Formula D |
| $M^bO_2$ | Formula E | wherein L, R, $M^a$ and $M^b$ are each as defined hereinbefore;
with a material of the formula F:

| | |
|---|---|
| $MgW.zH_2O$ | Formula F | wherein z ranges from 0 to 5 and W is selected from $CO_3.Mg(OH)_2$ or O;

in the presence of a suitable organic solvent;
(ii) evaporating the organic solvent and pressing the resulting powder to form a pellet;
(iii) calcinating the pellet one or more times; and
(iv) optionally sintering in the presence of an additive and $MnO_2$.

In another aspect, the present invention provides a single phase ceramic material defined herein obtainable by, obtained by or directly obtained by a process defined herein.

In another aspect, the present invention provides a thin film formed from a single phase ceramic material as defined herein.

In another aspect, the present invention provides a process of forming a thin film as defined herein, the process comprising depositing of a thin film of a single phase ceramic material defined herein onto a suitable support. In an embodiment of the invention, the deposition of a thin film of the single phase ceramic material defined herein is by a process selected from pulsed layer deposition (PLD), atomic layer deposition (ALD), chemical vapour deposition (CVD), molecular beam epitaxy (MBE), sputtering or physical vapour deposition (PVD).

In another aspect, the present invention provides an electronic component comprising a single phase ceramic material as defined herein or a thin film of a single phase ceramic material as defined herein. In an embodiment, the electronic component is selected from the group consisting of a memory device, a tunnel junction, a magnetic field sensor, a transmitter, a receiver, a transmitter-receiver module, a phase array system or a resonator.

In another aspect, the present invention provides an electronic device comprising an electronic component as defined herein. In an embodiment, the electronic device is selected from the group consisting of a tunable microwave device (e.g. attenuator, band bass filter or phase shifter).

In another embodiment of the invention there is provided the use of a single phase ceramic material as defined herein as a multiferroic.

In another embodiment of the invention there is provided the use of a single phase ceramic material as defined herein in an electronic component as defined herein.

DETAILED DESCRIPTION OF THE INVENTION

Definitions

Unless otherwise stated, the following terms used in the specification and claims have the following meanings set out below.

Herein, unless stated otherwise, the term "multiferroic" refers to materials that simultaneously possess ferromagnetic and ferroelectric properties.

Herein, a "single phase ceramic material" refers to an inorganic, non-metallic material made from compounds of a metal and a non-metal, which exists as a single phase or solid solution. That is to say the materials have one homogeneous structure and substantially uniform physical properties.

Herein, a "morphotropic phase boundary" refers to the phase transition between various different ferroelectric phases as a result of varying the composition or mechanical pressure of the material. Upon approaching the morphotropic phase boundary the crystal structure of the material changes and the dielectric and electromechanical properties of the material tend towards maximum.

Herein, a "solid solution" refers to a homogenous crystalline structure in which two or more elements or materials share a common crystal lattice. In a solid solution the most abundant atomic form, or material, is referred to as the "solvent" and the less abundant atomic form, or material, as the "solute". Typically, upon addition of "solutes" the crystal structure of the "solvent" remains unchanged.

Herein, the "Curie temperature" refers to the temperature at which a material's permanent magnetism changes to induced magnetism and/or the temperature at which a material's spontaneous electric polarisation changes to induced electric polarisation, or vice versa.

Herein, the "Neel temperature" refers to the temperature at which an antiferromagnetic material becomes paramagnetic. The term may be considered to be the antiferromagnetic Curie temperature.

By "continuous percolating network of magnetic cations" we mean that the magnetic cations form an interconnected network distributed throughout the morphotropic phase boundary.

Herein, a "perovskite" refers to the crystal structure of any material that has the general stoichiometry $ABX_3$, where "A" and "B" are cations and "X" is an anion. The term "perovskite" derives from the name given to the mineral $CaTiO_3$. Typically, in a perovskite structure the A cations occupy the holes created by a three-dimensional network of corner-sharing $BO_6$ octahedra, giving the A cation a 12-fold oxygen coordination, and the B-cation a 6-fold oxygen coordination. The symmetry of an ideal perovskite is cubic (e.g. $SrTiO_3$) but the structure exhibits numerous low-symmetry forms which depend upon chemical composition, temperature and pressure (e.g. $CaTiO_3$ is orthorhombic).

Herein, "calcinating" or "calcination" refers to the process of subjecting a material or substance to heat, in the presence of oxygen or air, for the purpose of causing some change in its physical or chemical composition. Calcination is usually undertaken to either; (i) remove water; (ii) remove $CO_2$ and other volatiles; or to (iii) oxidise part or all of the substance.

Herein, "milling" refers to the process of grinding materials into a fine powder, for example by use of a ball mill.

Herein, "sintering" refers to the process of compacting or forming a solid mass of material by use of heat and/or pressure without causing the material to melt.

Herein, a "thin film" refers to a thin layer of high purity material with thickness ranging from nanometres to micrometres that is typically deposited onto the surface of a material or substrate. Thin films may be deposited by any suitable deposition technique known in the art.

Herein, "sputtering" refers to a process of ejecting material (atoms) from a target material by bombardment of high energy particles, such that the ejected material is deposited onto a second "substrate" material, such as a silicon wafer.

Where the quantity or concentration of a particular component of a given composition is specified as a weight percentage (wt % or % w/w), said weight percentage refers to the percentage of said component by weight relative to the total weight of the composition as a whole. It will be understood by those skilled in the art that the sum of weight percentages of all components of a composition will total 100 wt %. However, where not all components are listed (e.g. where compositions are said to "comprise" one or more particular components), the weight percentage balance may optionally be made up to 100 wt % by unspecified ingredients (e.g. a diluent, such as water, or other non-essentially but suitable additives).

Materials of the Invention

In one aspect, the invention provides a single phase ceramic material comprising a morphotropic phase boundary and a continuous percolating network of magnetic cations.

In an embodiment, the single phase ceramic material of the present invention consists essentially of a morphotropic phase boundary and a continuous percolating network of magnetic cations.

In a further embodiment, the single phase ceramic material of the present invention consists of a morphotropic phase boundary and a continuous percolating network of magnetic cations.

Suitably, the ceramic material comprising a morphotropic phase boundary is ferroelectric and the magnetic cations are present in an amount sufficient to impart ferromagnetic properties to the material.

In another embodiment, the single phase ceramic material has an electronic polarisation of greater than 5 $\mu C/cm^2$. Suitably, the single phase ceramic material has an electronic polarisation of greater than 10 $\mu C/cm^2$. Most suitably, the single phase ceramic material has an electronic polarisation of greater than 15 $\mu C/cm^2$.

In another embodiment, the single phase ceramic material is substantially lead free.

In an embodiment, the single phase ceramic material as defined herein is multiferroic at a temperature of between 273K and 473K or 243K and 473K. In another embodiment, the single phase ceramic material is multiferroic at a temperature of between 273K and 473K. In another embodiment, the single phase ceramic material is multiferroic at a temperature of between 273K and 370K. In yet another embodiment, the single phase ceramic material is multiferroic at a temperature of between 293K and 370K. In yet still another embodiment, the single phase ceramic material is multiferroic at a temperature of between 293K and 323K.

In a further embodiment, the single phase ceramic material is multiferroic at a temperature above 243K.

In a further embodiment, the single phase ceramic material is multiferroic at a temperature above 273K. Suitably, the single phase ceramic material is multiferroic at a temperature above 293K.

Suitably the single phase ceramic material is a material of the formula (I) shown below:

$$(1-x)LM^a{}_{(1-y)/2}Fe_yMg_{(1-y)/2}O_3 - xQ \qquad (I)$$

wherein:
x is a value ranging from 0.01 to 0.4;
y is a value ranging from 0.01 to 0.9;
L is selected from Bi, La, Ce, Pr, Nd, Pm, Sm, Eu, Gd, Tb, Dy, Ho, Er, Tm, Yb, Lu or Y;
$M^a$ is selected from Ti or Zr; and
Q is:
(i) a group of formula:

$$RM^bO_3$$

wherein:
R is selected from Ca, Sr or Ba; and
$M^b$ is selected from Ti, Hf or Zr;
(ii) a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $PbZr_{1-p}Ti_pO_3$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
p is a value ranging from 0 to 1;

q is a value ranging from 0 to 1;
r is a value ranging from 0 to 1;
$M^c$ is selected from Mg, Ni, Cu, Mn, Co, Fe or Zn;
$M^d$ is selected from Fe, Mn, Cr; and
$M^e$ and $M^f$ are independently selected from one or more of the following Zn, Ti, Sn, Mg, Nb, Ta, W, Li, Ni, Cu, Fe, Cr or Mn.

Particular materials of the invention include, for example, materials of the formula (I), wherein, unless otherwise stated, each of L, Q, R, $M^a$, $M^b$, x, y and any associated substituent groups, has any of the meanings defined hereinbefore or is as defined in any one of paragraphs (1) to (40) hereinafter:

(1) L is selected from Bi, La, Ce, Nd, Gd, Tm, Yb, Lu or Y;
(2) L is selected from Bi, La, Nd or Y;
(3) L is Bi;
(4) Q is
 (i) a group of formula:

$RM^bO_3$ wherein:
 R is selected from Ca, Sr or Ba; and
 $M^b$ is selected from Ti, Hf or Zr;
 (ii) a group selected from one or more of the following: $[BiM^dO_3]_q[Bi(M^e)_r(M^f)_{(1-r)}O_3]$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
 wherein:
 Ln is selected from La, Ce, Pr, Nd, Pm, Sm, Eu, Gd, Tb, Dy, Ho, Er, Tm, Yb, Lu or Y;
 q is a value ranging from 0 to 1;
 r is a value ranging from 0 to 1;
 $M^b$ is selected from Mg, Ni, Cu, Mn, Co, Fe or Zn;
 $M^d$ is selected from Fe, Mn, Cr; and
 $M^e$ and $M^f$ are independently selected from one or more of the following Zn, Ti, Sn, Mg, Nb, Ta, W, Li, Ni, Cu, Fe, Cr or Mn.

(5) Q is
 (i) a group of formula:

$RM^bO_3$ wherein:
 R is selected from Ca, Sr or Ba; and
 $M^b$ is selected from Ti, Hf or Zr;
 (ii) a group selected from one or more of the following: $[BiM_dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
 wherein:
 Ln is selected from La, Ce, Pr, Nd, Pm, Sm, Eu, Gd, Tb, Dy, Ho, Er, Tm, Yb, Lu or Y;
 q is a value ranging from 0 to 1;
 r is a value ranging from 0 to 1;
 $M^c$ is selected from Mg, Ni, Cu or Zn;
 $M^d$ is selected from Fe, Mn, Cr; and
 $M^e$ and $M^f$ are independently selected from one or more of the following Zn, Ti, Sn, Mg, Nb, Ta, W, Li, Ni, Cu, Fe, Cr or Mn.

(6) Q is
 (i) a group of formula:

$RM^bO_3$ wherein:
 R is selected from Ca, Sr or Ba; and
 $M^b$ is selected from Ti, Hf or Zr;
 (ii) a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
 wherein:
 Ln is selected from La, Ce, Pr, Nd, Pm, Sm, Eu, Gd, Tb, Dy, Ho, Er, Tm, Yb, Lu or Y;
 q is a value ranging from 0 to 1;
 r is a value ranging from 0 to 1;
 $M^c$ is selected from Mg, Ni, Cu or Zn;
 $M^d$ is selected from Fe or Cr; and
 $M^e$ and $M^f$ are independently selected from one or more of the following Zn, Ti, Sn, Mg, Nb, Ta, W, Li, Ni, Cu, Fe, Cr or Mn.

(7) Q is
 (i) a group of formula:

$RM^bO_3$ wherein:
 R is selected from Ca, Sr or Ba; and
 $M^b$ is selected from Ti, Hf or Zr;
 (ii) a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
 wherein:
 Ln is selected from La, Ce, Pr, Nd, Pm, Sm, Eu, Gd, Tb, Dy, Ho, Er, Tm, Yb, Lu or Y;
 q is a value ranging from 0 to 1;
 r is a value ranging from 0 to 1;
 $M^c$ is selected from Mg, Ni, Cu or Zn;
 $M^d$ is selected from Fe or Cr; and
 $M^e$ and $M^f$ are independently selected from one or more of the following Zn, Ti, Ni, Cu, Fe, Cr or Mn.

(8) Q is
 (i) a group of formula:

$RM^bO_3$ wherein:
 R is selected from Ca, Sr or Ba; and
 $M^b$ is selected from Ti, Hf or Zr;
 (ii) a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
 wherein:
 Ln is selected from La, Ce, Pr, Nd, Pm, Sm, Eu, Gd, Tb, Dy, Ho, Er, Tm, Yb, Lu or Y;
 q is a value ranging from 0 to 1;
 r is a value ranging from 0 to 1;
 $M^c$ is selected from Mg, Ni, Cu or Zn;
 $M^d$ is Fe; and
 $M^e$ and $M^f$ are independently selected from one or more of the following Zn, Ti, Ni, Cu, Fe, Cr or Mn.

(9) Q is
 (i) a group of formula:

$RM^bO_3$ wherein:
 R is selected from Ca, Sr or Ba; and
 $M^b$ is selected from Ti, Hf or Zr;
 (ii) a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;

wherein:
Ln is selected from La, Ce, Pr, Nd, Pm, Sm, Eu, Gd, Tb, Dy, Ho, Er, Tm, Yb, Lu or Y;
q is a value ranging from 0 to 1;
r is a value ranging from 0 to 1;
$M^c$ is selected from Mg, Ni, Cu or Zn;
$M^d$ is Fe; and
$M^e$ and $M^f$ are independently selected from one or more of the following Zn, Ti, Ni or Cr.

(10) Q is
(i) a group of formula:

$$RM^bO_3$$

wherein:
R is selected from Ca, Sr or Ba; and
$M^b$ is selected from Ti, Hf or Zr;
(ii) a group selected from one or more of the following:
$[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
q is a value ranging from 0 to 1;
r is a value ranging from 0 to 1;
$M^c$ is selected from Mg, Ni, Cu or Zn;
$M^d$ is Fe; and
$M^e$ and $M^f$ are independently selected from one or more of the following Ti or Ni.

(11) Q is
(i) a group of formula:

$$RM^bO_3$$

wherein:
R is selected from Ca, Sr or Ba; and
$M^b$ is selected from Ti, Hf or Zr;
(ii) a group selected from one or more of the following:
$[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
q is a value ranging from 0 to 1;
r is a value ranging from 0 to 1;
$M^c$ is selected from Mg or Cu;
$M^d$ is Fe; and
$M^e$ and $M^f$ are independently selected from one or more of the following Ti or Ni.

(12) Q is
(i) a group of formula:

$$RM^bO_3$$

wherein:
R is selected from Ca, Sr or Ba; and
$M^b$ is selected from Ti, Hf or Zr;
(ii) a group selected from one or more of the following:
$[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
q is a value ranging from 0 to 1;
r is a value ranging from 0.25 to 0.75;
$M^c$ is selected from Mg or Cu;
$M^d$ is Fe; and
$M^e$ and $M^f$ are independently selected from one or more of the following Ti or Ni.

(13) Q is
(i) a group of formula:

$$RM^bO_3$$

wherein:
R is selected from Ca, Sr or Ba; and
$M^b$ is selected from Ti, Hf or Zr;
(ii) a group selected from one or more of the following:
$[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
q is 0.25;
r is value ranging from 0.25 to 0.75;
$M^c$ is selected from Mg or Cu;
$M^d$ is Fe; and
$M^e$ and $M^f$ are independently selected from one or more of the following Ti or Ni.

(14) Q is
(i) a group of formula:

$$RM^bO_3$$

wherein:
R is selected from Ca, Sr or Ba; and
$M^b$ is selected from Ti, Hf or Zr;
(ii) a group selected from one or more of the following:
$[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
q is a value ranging from 0 to 1;
r is 0.5;
$M^c$ is selected from Mg or Cu;
$M^d$ is Fe; and
$M^e$ and $M^f$ are independently selected from one or more of the following Ti or Ni.

(15) Q is
(i) a group of formula:

$$RM^bO_3$$

wherein:
R is selected from Ca, Sr or Ba; and
$M^b$ is selected from Ti, Hf or Zr;
(ii) a group selected from one or more of the following:
$[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
q is a value ranging from 0.2 to 0.5;
r is 0.5;
$M^c$ is selected from Mg or Cu;
$M^d$ is Fe; and
$M^e$ and $M^f$ are independently selected from one or more of the following Ti or Ni.

(16) Q is
(i) a group of formula:

$$RM^bO_3$$

wherein:
R is selected from Ca, Sr or Ba; and
$M^b$ is selected from Ti, Hf or Zr;
(ii) a group selected from one or more of the following:
$BiTi_{3/8}Fe_{2/8}Ni_{3/8}O_3$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$, wherein Ln is selected from La, Ce, Pr, Nd, Pm, Sm, Eu, Gd, Tb, Dy, Ho, Er, Tm, Yb, Lu or Y;

(17) Q is
(i) a group of formula:

$RM^bO_3$ wherein:
R is selected from Ca, Sr or Ba; and
$M^b$ is selected from Ti, Hf or Zr; or
(ii) a group selected from one or more of the following:
$BiTi_{3/8}Fe_{2/8}Ni_{3/8}O_3$, $CaZrO_3$, $NaNbO_3$, $Ca_2FeNbO_6$, $LnScO_3$, $LnGaO_3$ or $Ln_2TiM^cO_6$, wherein Ln is selected from La, Ce, Pr, Nd, Pm, Sm, Eu, Gd, Tb, Dy, Ho, Er, Tm, Yb, Lu or Y, and wherein $M^c$ is selected from Mg, Ni, Cu or Zn.

(18) Q is
(i) a group of formula:

$RM^bO_3$ wherein:
R is selected from Ca, Sr or Ba; and
$M^b$ is selected from Ti, Hf or Zr; or
(ii) a group selected from one or more of the following:
$BiTi_{3/8}Fe_{2/8}Ni_{3/8}O_3$, $CaZrO_3$, $NaNbO_3$, $Ca_2FeNbO_6$, $LnScO_3$, $LnGaO_3$ or $LnTiM^cO_6$, wherein Ln is selected from Bi, La, Nd or Y, and wherein $M^c$ is selected from Mg, Ni, Cu or Zn.

(19) Q is
(i) a group of formula:

$RM^bO_3$ wherein:
R is selected from Ca, Sr or Ba; and
$M^b$ is selected from Ti, Hf or Zr; or
(ii) a group selected from one or more of the following:
$BiTi_{3/8}Fe_{2/8}Ni_{3/8}O_3$, $CaZrO_3$, $NaNbO_3$, $Ca_2FeNbO_6$, $LnScO_3$, $LnGaO_3$ or $LnTiM^cO_6$, wherein Ln is selected from La, Ce, Pr, Nd, Pm, Sm, Eu, Gd, Tb, Dy, Ho, Er, Tm, Yb, Lu or Y, and wherein $M^c$ is selected from Mg or Cu.

(20) Q is
(i) a group of formula:

$RM^bO_3$ wherein:
R is selected from Ca, Sr or Ba; and
$M^b$ is selected from Ti, Hf or Zr; or
(ii) a group selected from one or more of the following:
$BiTi_{3/8}Fe_{2/8}Ni_{3/8}O_3$, $CaZrO_3$, $NaNbO_3$, $Ca_2FeNbO_6$, $LnScO_3$, $LnGaO_3$ or $LnTiM^cO_6$, wherein Ln is selected from Bi, La, Nd or Y, and wherein $M^c$ is selected from Mg or Cu.

(21) Q is
(i) a group of formula:

$RM^bO_3$ wherein:
R is selected from Ca, Sr or Ba; and
$M^b$ is selected from Ti, Hf or Zr; or (ii) a group selected from one or more of the following: $BiTi_{3/8}Fe_{2/8}Ni_{3/8}O_3$, $CaZrO_3$, $NaNbO_3$ or $Ca_2FeNbO_6$.
(22) Q is a group of formula $RM^bO_3$ as defined in any one of paragraphs (4) to (21) above;
(23) Q is $CaTiO_3$;
(24) R is Ca or Sr;
(25) R is Ca or Hf;
(26) R is Ca;
(27) $M^a$ is Ti;
(28) $M^b$ is Ti or Hf;
(29) $M^b$ is Ti or Zr;
(30) $M^b$ is Ti;
(31) x is between 0.01 and 0.25;
(32) x is between 0.05 and 0.20;
(33) x is between 0.08 and 0.18;
(34) x is between 0.1 and 0.16;
(35) x is 0.15;
(36) y is between 0.1 and 0.9;
(37) y is between 0.3 and 0.9;
(38) y is between 0.5 and 0.9;
(39) y is between 0.6 and 0.9;
(40) y is between 0.75 and 0.85;

In an embodiment of the materials of formula (I):
L is as defined in any one of paragraphs (1) to (3) above;
Q is as defined in any one of paragraphs (4) to (23) above;
R is as defined in any of paragraphs (24) to (26) above;
$M^a$ is as defined in paragraph (27) above;
$M^b$ is as defined in any of paragraph (28) to (30) above;
x is as defined in any one of paragraphs (31) to (35) above; and
y is as defined in any one of paragraphs (36) to (40) above.

In an embodiment of the materials of formula (I):
L is as defined in paragraph (3) above;
Q is as defined in any one of paragraphs (4) to (23) above;
R is as defined in any of paragraphs (24) to (26) above;
$M^a$ is as defined in paragraph (27) above;
$M^b$ is as defined in paragraph (30) above;
x is as defined in any one of paragraphs (31) to (35) above; and
y is as defined in any one of paragraphs (36) or (40) above.

In an embodiment of the materials of formula (I):
L is as defined in paragraph (3) above;
Q is a defined in any one of paragraphs (10) to (23) above;
R is as defined in paragraph (26) above;
$M^a$ is as defined in paragraph (27) above;
$M^b$ is as defined in any of paragraphs (30) above;
x is as defined in any of paragraphs (31) or (35) above; and
y is as defined in any of paragraphs (36) or (40) above.

In an embodiment of the materials of formula (I):
L is as defined in paragraph (3) above;
Q is a defined in any one of paragraphs (16) to (23) above;
R is as defined in paragraph (26) above;
$M^a$ is as defined in paragraph (27) above;
$M^b$ is as defined in any of paragraphs (30) above;
x is as defined in any of paragraphs (31) or (35) above; and
y is as defined in any of paragraphs (36) or (40) above.

In an embodiment of the materials of formula (I):
L is as defined in paragraph (3) above;
Q is a defined in any one of paragraphs (16) to (23) above;
R is as defined in paragraph (26) above;
$M^a$ is as defined in paragraph (27) above;

$M^b$ is as defined in any of paragraphs (30) above;
x is as defined in any of paragraphs (33) or (35) above; and
y is as defined in any of paragraphs (37) or (40) above.
In an embodiment of the materials of formula (I):
L is as defined in paragraph (3) above;
Q is a defined in any one of paragraphs (20) to (23) above;
R is as defined in paragraph (26) above;
$M^a$ is as defined in paragraph (27) above;
$M^b$ is as defined in any of paragraphs (30) above;
x is as defined in any of paragraphs (33) or (35) above; and
y is as defined in any of paragraphs (37) or (40) above.
In an embodiment of the materials of formula (I):
L is as defined in paragraph (3) above;
Q is a defined in any one of paragraphs (20) to (23) above;
R is as defined in paragraph (26) above;
$M^a$ is as defined in paragraph (27) above;
$M^b$ is as defined in any of paragraphs (30) above;
x is as defined in any of paragraphs (34) or (35) above; and
y is as defined in any of paragraphs (39) or (40) above.
In an embodiment of the materials of formula (I):
L is as defined in paragraph (3) above;
Q is a defined in any one of paragraphs (22) to (23) above;
R is as defined in paragraph (26) above;
$M^a$ is as defined in paragraph (27) above;
$M^b$ is as defined in any of paragraphs (30) above;
x is as defined in any of paragraphs (34) or (35) above; and
y is as defined in any of paragraphs (39) or (40) above.
In an embodiment of the materials of formula (I):
L is as defined in paragraph (3) above;
Q is a defined in any one of paragraphs (22) to (23) above;
R is as defined in paragraph (26) above;
$M^a$ is as defined in paragraph (27) above;
$M^b$ is as defined in any of paragraphs (30) above;
x is as defined in paragraph (35) above; and
y is as defined in any of paragraphs (39) or (40) above.
In an embodiment of the materials of formula (I):
L is as defined in paragraph (3) above;
Q is a defined in paragraph (23) above;
R is as defined in paragraph (26) above;
$M^a$ is as defined in paragraph (27) above;
$M^b$ is as defined in any of paragraphs (30) above;
x is as defined in paragraph (35) above; and
y is as defined in any of paragraphs (39) or (40) above.
In a particular group of materials of the invention, L is Bi and Q is $RM^bO_3$, i.e. the compounds have the structural formula (Ia) [a sub-definition of formula (I)] shown below:

$$(1-x)\text{BiM}^a_{(1-y)/2}\text{Fe}_y\text{Mg}_{(1-y)/2}\text{O}_3\text{-}x\text{RM}^b\text{O}_3 \quad (\text{Ia})$$

wherein:
x is a value ranging from 0.01 to 0.4;
y is a value ranging from 0.01 to 0.9;
R is selected from Ca, Sr or Ba; and
$M^a$ and $M^b$ are independently selected from Ti or Zr
In an embodiment of the compounds of formula (Ia):
R is as defined in any of paragraphs (24) to (26) above;
$M^a$ is as defined in paragraph (27) above;
$M^b$ is as defined in any of paragraphs (28) to (30) above;
x is as defined in any of paragraphs (31) to (35) above; and
y is as defined in any of paragraphs (36) to (40) above.
In an embodiment of the compounds of formula (Ia):
R is as defined in paragraph (26) above;
$M^a$ is as defined in paragraph (27) above;
$M^b$ is as defined in any of paragraphs (28) to (30) above;

x is as defined in any of paragraphs (31) to (35) above; and
y is as defined in any of paragraphs (36) to (40) above.
In an embodiment of the compounds of formula (Ia):
R is as defined in paragraph (26) above;
$M^a$ is as defined in paragraph (27) above;
$M^b$ is as defined in paragraph (28) above;
x is as defined in any of paragraphs (31) to (35) above; and
y is as defined in any of paragraphs (36) to (40) above.
In an embodiment of the compounds of formula (Ia):
R is as defined in paragraph (26) above;
$M^a$ is as defined in paragraph (27) above;
$M^b$ is as defined in paragraph (28) above;
x is as defined in any of paragraphs (34) to (35) above; and
y is as defined in any of paragraphs (38) to (40) above.
In an embodiment of the compounds of formula (Ia):
R is as defined in paragraph (26) above;
$M^a$ is as defined in paragraph (27) above;
$M^b$ is as defined in paragraph (28) above;
x is as defined in paragraph (35) above; and
y is as defined in any of paragraphs (38) to (40) above.
In an embodiment, the material is selected from any one of the following:

$(1-x)\text{BiTi}_{(1-y)/2}\text{Fe}_y\text{Mg}_{(1-y)/2}\text{O}_3\text{-}x\text{CaTiO}_3$, wherein $x=0.15$ and $y=0.6$;

$(1-x)\text{BiTi}_{(1-y)/2}\text{Fe}_y\text{Mg}_{(1-y)/2}\text{O}_3\text{-}x\text{CaTiO}_3$, wherein $x=0.15$ and $y=0.7$;

$(1-x)\text{BiTi}_{(1-y)/2}\text{Fe}_y\text{Mg}_{(1-y)/2}\text{O}_3\text{-}x\text{CaTiO}_3$, wherein $x=0.15$ and $y=0.75$;

$(1-x)\text{BiTi}_{(1-y)/2}\text{Fe}_y\text{Mg}_{(1-y)/2}\text{O}_3\text{-}x\text{CaTiO}_3$, wherein $x=0.15$ and $y=0.8$;

$(1-x)\text{BiTi}_{(1-y)/2}\text{Fe}_y\text{Mg}_{(1-y)/2}\text{O}_3\text{-}x\text{CaTiO}_3$, wherein $x=0.15$ and $y=0.85$;

$(1-x)\text{BiTi}_{(1-y)/2}\text{Fe}_y\text{Mg}_{(1-y)/2}\text{O}_3x\text{CaTiO}_3$, wherein $x=0.15$ and $y=0.9$.

In another embodiment, the invention provides a single phase ceramic material comprising/consisting essentially of/consisting of:
(i) a single phase material of formula (I) as defined herein; and
(ii) a further material, optionally selected from one or more of the following: $[\text{BiM}^d\text{O}_3]_q[\text{Bi}(M^e)_r(M^f)_{(1-r)}\text{O}_3]_{(1-q)}$, $\text{CaZrO}_3$, $\text{SrZrO}_3$, $\text{BaZrO}_3$, $\text{KNbO}_3$, $\text{NaNbO}_3$, $\text{Ca}_2\text{FeNbO}_6$, $\text{PbZr}_{1-p}\text{Ti}_p\text{O}_3$, $\text{LnScO}_3$, $\text{LnGaO}_3$ or $\text{Ln}_2\text{TiM}^c\text{O}_6$;
wherein:
Ln is selected from La, Ce, Pr, Nd, Pm, Sm, Eu, Gd, Tb, Dy, Ho, Er, Tm, Yb, Lu or Y;
p is a value ranging from 0 to 1;
q is a value ranging from 0 to 1;
r is a value ranging from 0 to 1;
$M^c$ is selected from Mg, Ni, Cu, Mn, Co, Fe or Zn;
$M^d$ is selected from Fe, Mn, Cr; and
$M^e$ and $M^f$ are independently selected from one or more of the following Zn, Ti, Sn, Mg, Nb, Ta, W, Li, Ni, Cu, Fe, Cr or Mn.
In another embodiment, the invention provides a single phase ceramic material comprising/consisting essentially of/consisting of:
(i) a single phase material of formula (I) as defined herein; and
(ii) a further material, optionally selected from one or more of the following: $[\text{BiM}^d\text{O}_3]_q[\text{Bi}(M^e)_r(M^f)_{(1-r)}$ $O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;

wherein:

Ln is selected from La, Ce, Pr, Nd, Pm, Sm, Eu, Gd, Tb, Dy, Ho, Er, Tm, Yb, Lu or Y;

q is a value ranging from 0 to 1;

r is a value ranging from 0 to 1;

$M^c$ is selected from Mg or Cu;

$M^d$ is selected from Fe, Mn, Cr; and $M^e$ and $M^f$ are independently selected from one or more of the following Zn, Ti, Sn, Mg, Nb, Ta, W, Li, Ni, Cu, Fe, Cr or Mn.

In another embodiment, the invention provides a single phase ceramic material comprising/consisting essentially of/consisting of:

(i) a single phase material of formula (I) as defined herein; and (ii) a further material, optionally selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;

wherein:

Ln is selected from La, Ce, Pr, Nd, Pm, Sm, Eu, Gd, Tb, Dy, Ho, Er, Tm, Yb, Lu or Y;

q is a value ranging from 0 to 1;

r is a value ranging from 0 to 1;

$M^c$ is selected from Mg, or Cu;

$M^d$ is Fe; and $M^e$ and $M^f$ are independently selected from one or more of the following Ti or Ni.

In another embodiment, the invention provides a single phase ceramic material comprising/consisting essentially of/consisting of:

(i) a single phase material of formula (I) as defined herein; and (ii) a further material, optionally selected from one or more of the following: $BiTi_{3/8}Fe_{2/8}Ni_{3/8}O_3$, $CaZrO_3$, $SrZrO_3$, $BaZrO_3$, $KNbO_3$, $NaNbO_3$, $Ca_2FeNbO_6$, $LnScO_3$, $LnGaO_3$, $LnTiM^cO_6$, wherein Ln is selected from La, Ce, Pr, Nd, Pm, Sm, Eu, Gd, Tb, Dy, Ho, Er, Tm, Yb, Lu or Y, and wherein $M^c$ is selected from Mg, Ni, Cu or Zn.

In another embodiment, the invention provides a single phase ceramic material comprising/consisting essentially of/consisting of:

(i) a single phase material of formula (I) as defined herein; and (ii) a further material, optionally selected from one or more of the following: $BiTi_{3/8}Fe_{2/8}Ni_{3/8}O_3$, $CaZrO_3$, $NaNbO_3$, $Ca_2FeNbO_6$, $LnScO_3$, $LnGaO_3$, $LnTiM^cO_6$, wherein Ln is selected from La, Ce, Pr, Nd, Pm, Sm, Eu, Gd, Tb, Dy, Ho, Er, Tm, Yb, Lu or Y, and wherein $M^c$ is selected from Mg, Ni, Cu or Zn.

In another embodiment, the invention provides a single phase ceramic material comprising/consisting essentially of/consisting of:

(i) a single phase material of formula (I) as defined herein; and (ii) a further material, optionally selected from one or more of the following: $BiTi_{3/8}Fe_{2/8}Ni_{3/8}O_3$, $CaZrO_3$, $NaNbO_3$, $Ca_2FeNbO_6$, $L_nScO_3$, $L_nGaO_3$, $L_nTiM^cO_6$, wherein $L_n$ is selected from La, Nd or Y, and wherein $M^c$ is selected from Mg, Ni, Cu or Zn.

In another embodiment, the invention provides a single phase ceramic material comprising/consisting essentially of/consisting of:

(i) a single phase material of formula (I) as defined herein; and (ii) a further material, optionally selected from one or more of the following: $BiTi_{3/8}Fe_{2/8}Ni_{3/8}O_3$, $CaZrO_3$, $NaNbO_3$, $Ca_2FeNbO_6$, $L_nScO_3$, $L_nGaO_3$, $L_nTiM^cO_6$, wherein $L_n$ is selected from La, Nd or Y, and wherein $M^c$ is selected from Mg or Cu.

Preparation of Materials

The materials of the present invention may be prepared by any suitable methodology known in the art. Particular examples of processes for preparing compounds of the present invention are set out in the accompanying examples.

In the description of the preparation methods described herein and in any referenced preparatory methods, it is to be understood that all proposed mixing and reaction conditions, including choice of any solvent present, the atmosphere, the applied temperature, the duration and any necessary work-up procedures, can be selected by a person skilled in the art.

As previously stated, the present invention provides a process for the preparation of a single phase ceramic material as defined herein, said process comprising forming a single phase ceramic material comprising a morphotropic phase boundary in the presence of a material capable of forming a continuous percolating network of magnetic cations within the morphotropic phase boundary of the ceramic material.

The present invention also provides a process for the preparation of a single phase ceramic material as defined herein, said process comprising sintering a material capable of forming a single phase ceramic material comprising a morphotropic phase boundary in the presence of a material capable of forming a continuous percolating network of magnetic cations within the morphotropic phase boundary of the ceramic material.

A person skilled in the art will be able to select appropriate sintering conditions in order to prepare a single phase ceramic material as defined herein.

The materials of the present invention may also be prepared using sol-gel or pyrolysis methods well known in the art.

For materials of formula (I) defined herein, the material of formula I may be prepared by any suitable methodology known in the art. Examples of suitable methodologies that could be used for forming such materials are described in, for example, Dolgos et al. Angew. Chem. Int. Ed. 2012, 51, 10770.

Suitably, the material of formula (I) is prepared by the process of:

(i) combining and milling (e.g. ball milling) ceramic materials of the formulae A to E shown below:

| | |
|---|---|
| $L_2O_3$ | Formula A |
| $RCO_3$ | Formula B |
| $Fe_2O_3$ | Formula C |
| $M^aO_2$ | Formula D |
| $M^bO_2$ | Formula E | wherein L, R, $M^a$ and $M^b$ are each as defined hereinbefore;

with a material of the formula F:

| | |
|---|---|
| MgW.$z$H$_2$O | Formula F | wherein z is an integer between 0-5, and W is selected from $CO_3.Mg(OH)_2$ or O;

in the presence of a suitable organic solvent;

(ii) evaporating the organic solvent and pressing the resulting powder to form a pellet;
(iii) calcinating the pellet one or more times; and
(iv) optionally sintering in the presence of a binder and $MnO_2$.

A person skilled in the art will be able to select suitable conditions (e.g. temperature, pressures, reaction times, agitation etc.) for this preparation.

It will be appreciated that the relative amounts of Formulae A to F mixed in step (i) of the process above will be selected in order to provide the stoichiometric ratio of each component in the final material of formula (I).

Any suitable milling or mixing process may be used for step (i) of the process defined above. In an embodiment, ball milling is used.

Any suitable solvent may be used for step (i) of the process defined above. Examples of suitable solvents may include methanol, ethanol, isopropanol or butanol, acetone, water. A particularly suitable solvent is ethanol.

A person skilled in the art will be able to select an appropriate size for the pellets described in step (ii) of the process defined above. A suitable size is, for example, between 1 mm and 50 mm. A particularly suitable size range is between 5 mm and 20 mm.

Any suitable number of calcination steps may be used for step (iii) of the process defined above. For example, one, two three or four calcination steps may be utilised. In an embodiment, the number of calcinations is two.

Any suitable temperature may be used for step (iii) of the process defined above. A suitable temperature range may be, for example, 900 to 980° C. A particularly suitable temperature range is 920 to 960° C.

Suitably, step (iv) is included in the process defined above. A person skilled in the art will be able to select suitable binders for step (iv) of the process defined above. Particularly suitable binders include polyvinyl butyral and polyvinyl acetate.

A person skilled in the art will also be able to select a suitable amount of binder described in step (iv) of the process defined above. A suitable amount of binder may be between 0-5 wt %. A particularly suitable amount is 1 to 3 wt %, for example 2 wt %.

Low level addition of elements and compositions (e.g. $MnO_2$) may optionally be added to the materials of the present invention in order to improve electrical properties and minimise dielectric loss.

A person of skill in the art will be able to select a suitable amount of $MnO_2$ for step (iv) of the process defined above. A suitable amount may be between 0 and 0.5 wt %. A particularly suitable amount is 0.1 to 0.3 wt %, for example 0.2 wt %.

A person of skill in the art will be able to select a suitable temperature for step (iv) of the process defined above. A suitable temperature range may be 900 to 980° C. A particularly suitable temperature range is 940 to 980° C.

In a particular embodiment of the invention z is 3.

In another aspect, the present invention provides a single phase ceramic material defined herein obtainable by, obtained by or directly obtained by a process defined herein.

Thin-Films

For most electronic applications, the materials of the present invention will be in the form of thin-films, typically thin films deposited on a suitable substrate.

Thus, in another aspect, the present invention provides a thin film formed from a single phase ceramic material as defined herein.

The thin-films of the present invention will be fabricated to have dimensions appropriate for the particular application concerned.

The thin-films can be prepared by deposition of the material of the present invention on a substrate. Any suitable deposition technique known in the art may be used. Examples of suitable deposition techniques that may be used include pulsed layer deposition (PLD), atomic layer deposition (ALD), chemical vapour deposition (CVD), molecular beam epitaxy (MBE), sputtering or physical vapour deposition (PVD).

Applications and Uses

The multiferroic single phase ceramic materials of the present invention are useful for any application in which materials having both ferroelectric and ferromagnetic properties could be used.

The materials of the present invention, and in particular the thin-film forms thereof, are therefore particularly suited to incorporation into electronic components and devices.

Therefore, in another aspect, the present invention provides an electronic component comprising a single phase ceramic material as defined herein, or a thin film of a single phase ceramic material as defined herein.

In an embodiment, the electronic component is selected from the group consisting of a memory device, a tunnel junction, a magnetic field sensor, a transmitter, a receiver, a transmitter-receiver module, a phase array system or a resonator.

In an embodiment, the electronic component is a memory device. In another embodiment the memory device is selected from MRAM, FERAM or MERAM.

Suitable techniques for preparing such electronic components are known in the art.

In another aspect, the present invention provides an electronic device comprising an electronic component as defined herein. In an embodiment, the electronic device is selected from the group consisting of a tunable microwave device (e.g. attenuator, band bass filter or phase shifter).

In another aspect, the present invention provides the use of a single phase ceramic material as defined herein as a multiferroic.

In another embodiment of the invention there is provided the use of a single phase ceramic material as defined herein in an electronic component as defined herein.

EXAMPLES

Abbreviations

AC alternating current
aixPES piezoelectric evaluation system
FC field cooling
K kelvin
ME magnetoelectric
MPMS magnetic property measurement system
Oe oersted
P(E) potential energy
ps picosiemens
PRAP piezoelectric resonance analysis program
PXRD powder X-ray diffraction
PZT lead zirconium titanate
TRM thermoremanent magnetisation
ZFC zero field cooling The invention will now be described, by way of example only, in order to further demonstrate the invention.

A number of materials were synthesised and their ferroelectric, ferromagnetic and multiferroic properties were tested, as described hereinbelow.

Examples of materials synthesised are as followed:

Example 1

(1-$x$)BiTi$_{(1-y)/2}$Fe$_y$Mg$_{(1-y)/2}$O$_3$-$x$CaTiO$_3$, wherein $x=0.15$ and $y=0.6$;

Example 2

(1-$x$)BiTi$_{(1-y)/2}$Fe$_y$Mg$_{(1-y)/2}$O$_3$-$x$CaTiO$_3$, wherein $x=0.15$ and $y=0.7$;

Example 3

(1-$x$)BiTi$_{(1-y)/2}$Fe$_y$Mg$_{(1-y)/2}$O$_3$-$x$CaTiO$_3$, wherein $x=0.15$ and $y=0.75$;

Example 4

(1-$x$)BiTi$_{(1-y)/2}$Fe$_y$Mg$_{(1-y)/2}$O$_3$-$x$CaTiO$_3$, wherein $x=0.15$ and $y=0.8$;

Example 5

(1-$x$)BiTi$_{(1-y)/2}$Fe$_y$Mg$_{(1-y)/2}$O$_3$-$x$CaTiO$_3$, wherein $x=0.15$ and $y=0.85$;

Example 6

(1-$x$)BiTi$_{(1-y)/2}$Fe$_y$Mg$_{(1-y)/2}$O$_3$-$x$CaTiO$_3$, wherein $x=0.15$ and $y=0.9$.

Further examples of the invention are described hereinbelow, by way of example only, with reference to the accompanying figures, in which.

METHODS AND EQUIPMENT

Unless stated otherwise, all reagents and solvents were commercially available and used as received.

Sample Preparation

Powder samples of (1-x)BiTi$_{(1-y)/2}$Fe$_y$Mg$_{(1-y)/2}$O$_3$-(x)CaTiO$_3$, in the compositional range x=0.15, y=0.60-0.90, were synthesised by a conventional solid-state reaction. The binary oxides Bi$_2$O$_3$, CaCO$_3$, Fe$_2$O$_3$, TiO$_2$ (pre-dried at 473 K) and MgCO$_3$.Mg(OH)$_2$.xH$_2$O (x~3, used as received) were weighed in stoichiometric amounts and ball milled in ethanol for 20 hours. The mixtures obtained after evaporating ethanol were pelletised and calcined at 1208 K for 12 hours in a platinum-lined alumina crucible. These pellets were then re-ground thoroughly and re-pelletised, and subjected to a second calcination at 1213 K for 12 hours in platinum-lined alumina crucibles. The resulting powders were found to contain only the target phase with no minority phases visible by PXRD. Dense pellets (>95% of crystallographic density) suitable for property measurements were produced from these powders by the following protocol: first, 2 wt % polyvinyl butyral binder and 0.2 wt % MnO$_2$ were added to the samples, and this mixture was ball-milled for 20 hours. The resulting mixture was then pelletised (8 mm diameter) with a uniaxial press, followed by pressing at ~2×10$^8$ Pa in a cold isostatic press. These pellets were loaded into a Pt-lined alumina boat. A programmable tube furnace was used to heat the reaction under flowing oxygen to 943 K for 1 hour, followed by 1228 K for 3 hours, followed by 1173 K for 12 hours before cooling to room temperature at 5 K min$^{-1}$. The resulting pellets were found to contain no minority phases by PXRD. Their densities were measured using an Archimedes balance.

Powder X-Ray Diffraction (PXRD)

All data were collected using a PANalytical X'Pert Pro diffractometer in Bragg-Brentano geometry with a monochromated Co K$_{\alpha 1}$ source ($\lambda$=1.78896 Å) and position-sensitive X'Celerator detector. Each sample was contained in a back-filled sample holder and rotated during the measurement. A programmable divergence slit was used to provide a constant illuminated area throughout the angular range. Data were collected in the angular range 5≤2θ≤130° in steps of 0.0167°. Pawley refinements were carried out using the software package Topas Academic (version 5). For each PXRD pattern, background was modelled using a Chebyschev polynomial function with 12 refined parameters. Lattice parameters, a sample height correction, peak profile functions and model-independent peak intensities were refined. Peak profiles were modelled with a modified Thompson-Cox-Hastings pseudo-Voigt function. When fitting data to a single phase (R3c or Pa cells), a Stephens anisotropic strain broadening function was refined. In two-phase (R3c+Pna2$_1$) refinements this function was refined only for the rhombohedral (R3c) phase.

Figure 1:
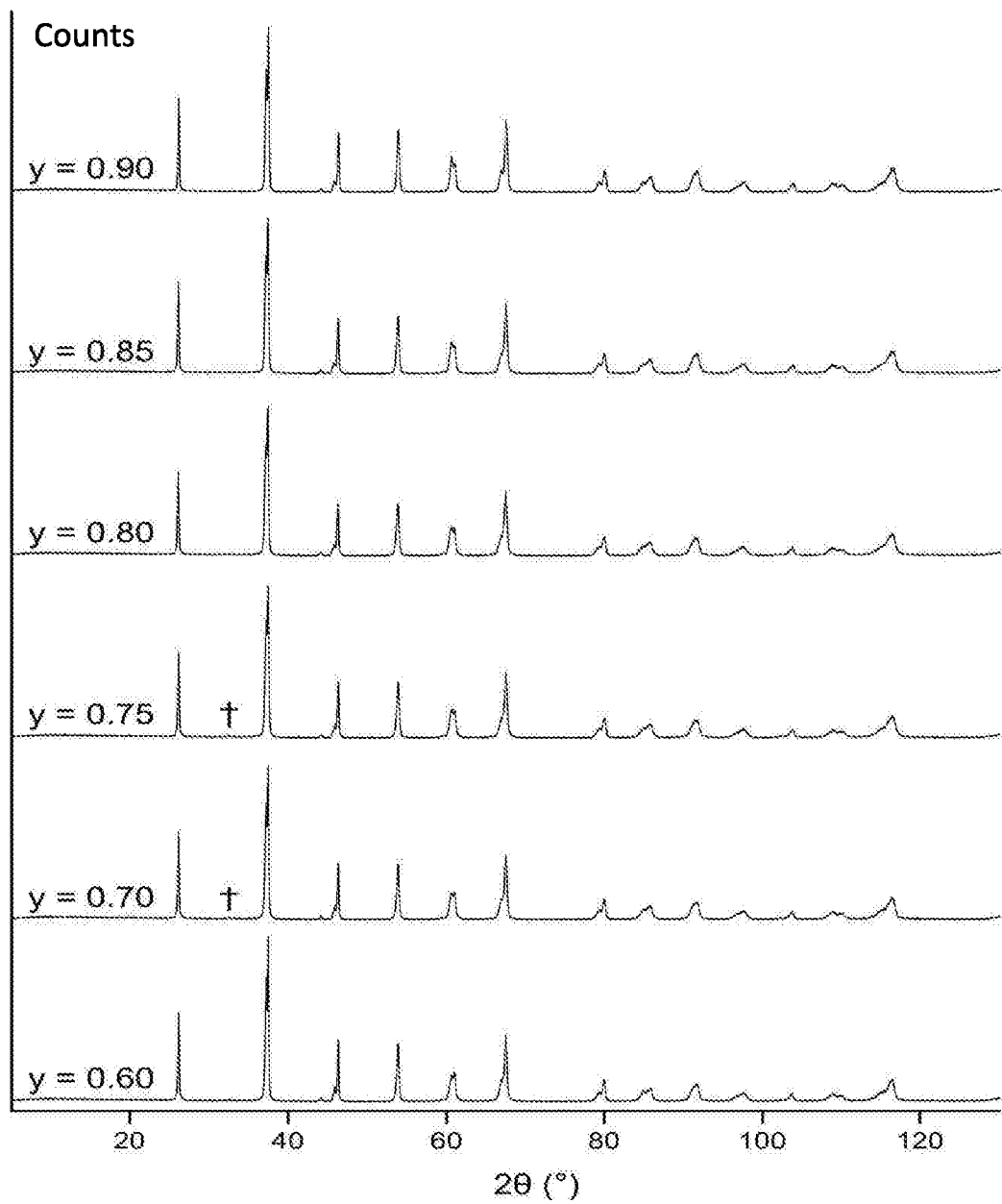
FIG. 1 shows the X-ray diffraction pattern of Examples 1-6 (bottom trace to top trace respectively).

FIG. 1 shows the X-ray diffraction pattern of Examples 1-6 (bottom trace to top trace respectively).

Figure 2:
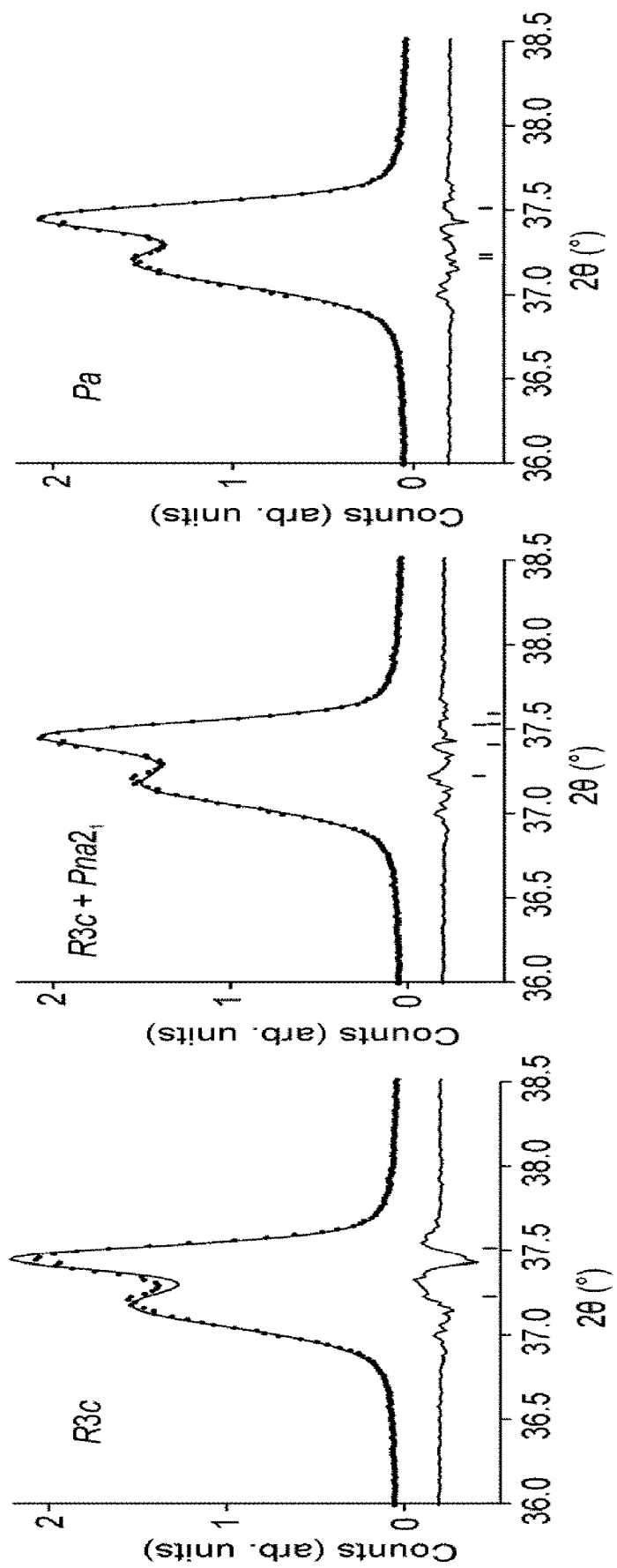
FIG. 2 shows Pawley fits to PXRD data from Example 4 using (f) a single R3c unit cell, (g) superimposed R3c and Pna2$_1$ unit cells, and (h) a single monoclinic Pa unit cell.

FIG. 2 shows Pawley fits to PXRD data from Example 4 using (f) a single R3c unit cell, (g) superimposed R3c and Pna2$_1$ unit cells, and (h) a single monoclinic Pa unit cell.

The compositions x=0.15, y=0.60 and y=0.80 (Examples 1 and 4) were selected for detailed property studies. Pawley refinements on these compositions show that a model with both R and O phases, and a single-phase monoclinic model in a √2a$_p$×2a$_p$×√2a$_p$ unit cell (space group Pa, which is a polar sub-group of both R3c and Pna2$_1$; refined lattice parameters shown in Table 1), both produce superior fits to that obtained by a purely rhombohedral model (Table 2) showing that these compositions exist in the morphotropic phase boundary region towards the rhombohedral limit, and hence that they are long-range ordered polar non-cubic materials.

TABLE 1

Refined lattice parameters obtained from Pawley fits to PXRD data of compositions x = 0.15, y = 0.60 and 0.80 (Examples 1 and 4), modelled in a $\sqrt{2}a_p \times 2a_p \times \sqrt{2}a_p$ cell in space group Pa.

| | Refined Lattice Parameters | | | | |
|---|---|---|---|---|---|
| Composition | a (Å) | b (Å) | c (Å) | y (°) | Volume (Å³) |
| x = 0.15, y = 0.60 (Example 1) | 5.6037(3) | 7.9047(6) | 5.5666(1) | 89.433(7) | 246.56(2) |
| x = 0.15, y = 0.80 (Example 4) | 5.6019(7) | 7.903(1) | 5.5641(1) | 89.40(1) | 246.32(5) |

TABLE 2

Comparison of agreement factors obtained from Pawley fits to PXRD data in three candidate models, for the two compositions x = 0.15, y = 0.60 and 0.80 (Examples 1 and 4).

| | Weighted Profile R-factor ($R_{wp}$) | | | Goodness of fit ($\chi^2$) | | |
|---|---|---|---|---|---|---|
| Composition | R3c | R3c + Pna2$_1$ | Pa | R3c | R3c + Pna2$_1$ | Pa |
| x = 0.15, y = 0.60 (Example 1) | 7.421 | 6.373 | 6.169 | 2.104 | 1.583 | 1.499 |
| x = 0.15, y = 0.80 (Example 4) | 6.883 | 6.136 | 5.969 | 1.821 | 1.477 | 1.392 |

Electrical Measurements

For electric poling, gold was sputtered on both sides of thin discs (150-200 μm with 20 μm tolerance). For P(E) measurements, silver conductive paint (RS components) was applied on both sides of thin discs and cured at 393 K for 10 minutes. The disc was loaded in a PVDF sample holder. Silicone oil was used as dielectric medium to avoid air breakdown. Measurements were conducted using a Radiant ferroelectric tester system.

Figure 3:
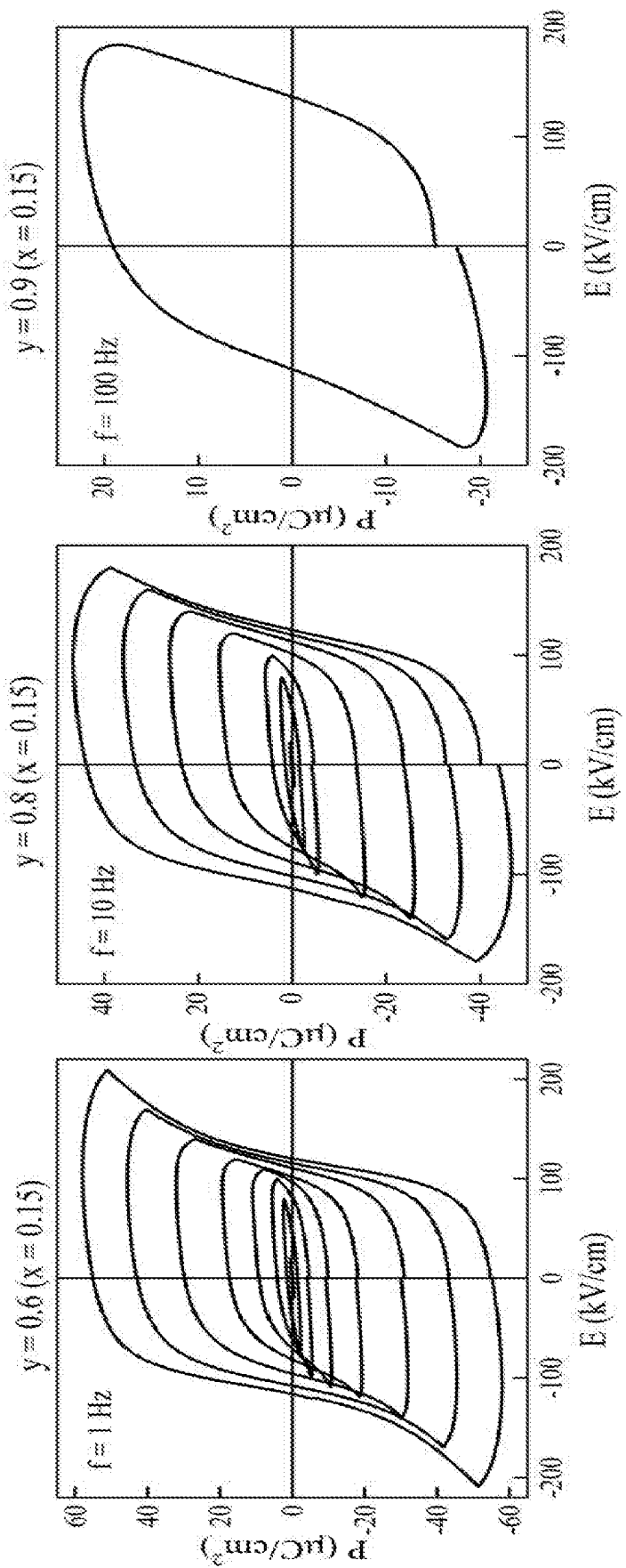
FIG. 3 shows the room temperature P(E) measurements on Examples 1, 4 and 6, confirming ferroelectricity.

FIG. 3 shows the P(E) measurements on thin discs of Examples 1, 4 and 6. Well saturated loops confirm ferroelectricity in these compositions.

The maximum polarisation ($P_{max}$) for Examples 1, 4 and 6 are 57 μC/cm², 46 μC/cm² and ~18 μC/cm² respectively.

Impedance Measurements

Impedance and phase angles were measured using an Agilent LCR meter E4980 by applying an AC voltage of 0.5 V.

Magnetic Measurements

Magnetic measurements were carried out using MPMS XL-7 and MPMS3 systems (Quantum Design, USA). For this, powder or pellet samples were loaded into a polycarbonate capsule and fixed into a straight drinking plastic straw and then loaded into a SQUID dc probe. The isothermal magnetisation data were decomposed using the general function:

$$M(H) = \sum_i m_i(H)$$

Where $m_i$ is a generic function describing a single magnetic component taking the form:

$$m_i(H) = a \cdot \tanh\left(\frac{H-b}{c}\right) + d$$

Where a represent the saturation magnetisation, b the coercive field, c a parameter describing the squareness of the loop, and d a linear term including paramagnetic, diamagnetic and antiferromagnetic contributions for the individual magnetic component. Above the magnetic ordering temperature of the perovskite phase only one component was used to describe the isothermal magnetisation assigned to a high Fe content impurity. Below the perovskite magnetic ordering temperature two components were used.

For Example 4, the magnetic isotherm (M(H)) data collected below $T_N$=370 K showed a hysteresis with finite coercive field (250 Oe) consistent with ferromagnetic behaviour.

Figure 4:
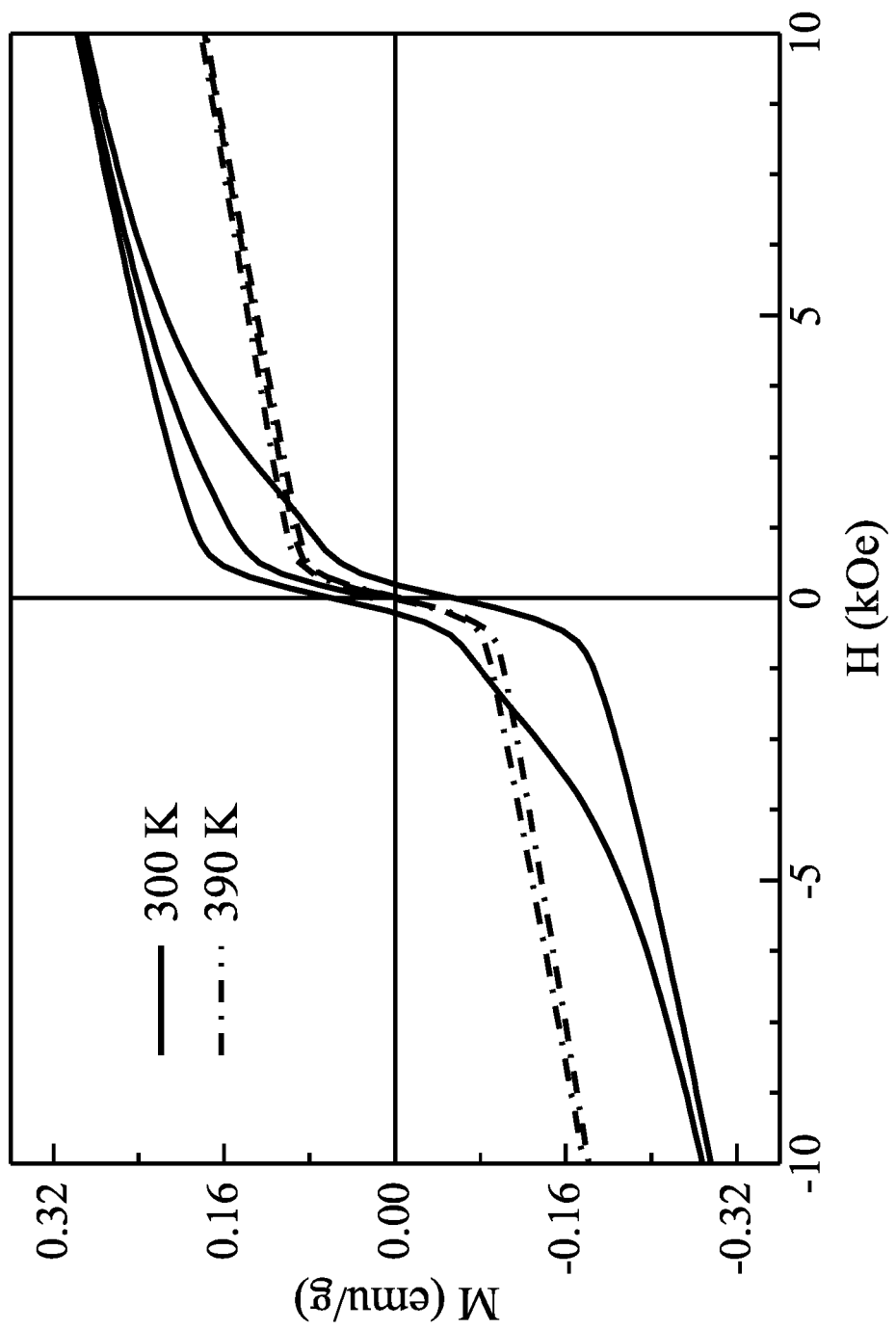
FIG. 4 shows the magnetic isotherms for Example 4.

FIG. 4 shows the magnetic isotherms obtained for Example 4.

Magnetoelectric Measurements

Details of the magnetoelectric measurements set-up and protocol are described elsewhere [18]. In this experiment, a sinusoidal electric field E=$E_{ac}$ cos ωt (ω=2 πf where f is frequency, $E_{ac}$ is the electric field amplitude) is applied across the disc and the first harmonic of the complex ac magnetic moment, m(t)=(m'-i.m")cos ωt is measured. The measurements were performed in the absence of any dc magnetic and electric fields. In this scenario, the real part of the electrically induced magnetic moment [18] is:

$$m' = (\alpha E_{ac}) \times \frac{V}{\mu_0}$$

where V is the sample volume. This moment involves only the linear ME (α) effect, whereas the higher order effects are zero. To demonstrate the linear ME effect on y=0.6 and 0.8, the electric field amplitude $E_{ac}$ was varied and the induced moment was recorded. Linear ME susceptibility (α) was calculated from a plot of volume ac magnetization amplitude $M_{ac}$ (=m'/V) vs $E_{ac}$ following the relation [19]:

$$|\alpha| = \mu_0 \cdot \frac{\Delta M_{ac}}{\Delta E_{ac}}.$$

All measurements were performed at f=1 Hz. The sensitivity of the experimental set-up used here is m'=V×$M_{ac}$>5× 10$^{-12}$ Am². Prior to ME measurements, discs were poled externally using aixPES (aixACCT Systems) at a field of 100 kV/cm for 15 minutes from 343 K to room temperature. Discs were then loaded into a modified dc SQUID probe at 300 K and subjected to a magnetic field of 2 T for 30 minutes. After removal of electric and magnetic fields, electrodes were short circuited for 15 minutes before conducting ME measurements at 300 K. For ME measurements at 10 and 150 K (for x=0.15, y=0.6), the sample was cooled down to the measurement temperature in the presence of an electric field (3.5 kV/cm) and a magnetic field (2 T) and the protocol for 300 K measurement was followed. For the temperature dependence of α, an electric field (3.5 kV/cm for y=0.6 and 2.7 kV/cm for y=0.8 respectively) and a magnetic field of 2 T were applied at 300 K followed by cooling to 10 K at a rate of 1 K min⁻¹, and the data was collected at 1 Hz. The temperature was stabilized for 5 minutes at each step prior to measurement. The room temperature bulk d.c. resistivity of x=0.15, y=0.6 is 33 GΩ·m, and that of x=0.15, y=0.8 is 21 GΩ·m. The leakage currents observed for y=0.6 and y=0.8 are 0.35 nA (320 K) and 0.23 nA (360 K) respectively at the maximum measurement fields. These values are too low to cause any artifacts in the ME measurements. The upper limit of temperature in this measurement set-up is 360 K.

To confirm whether the two order parameters (polarisation (P) and magnetisation (M)) are coupled, magnetoelectric measurements were performed on a disc poled both electrically and magnetically. The linear magnetoelectric (ME) coupling was measured as the slope of the magnetisation ($\mu_0 M$) induced by the applied electric field (E) plot as shown in FIG. 5(a).

Figure 5:
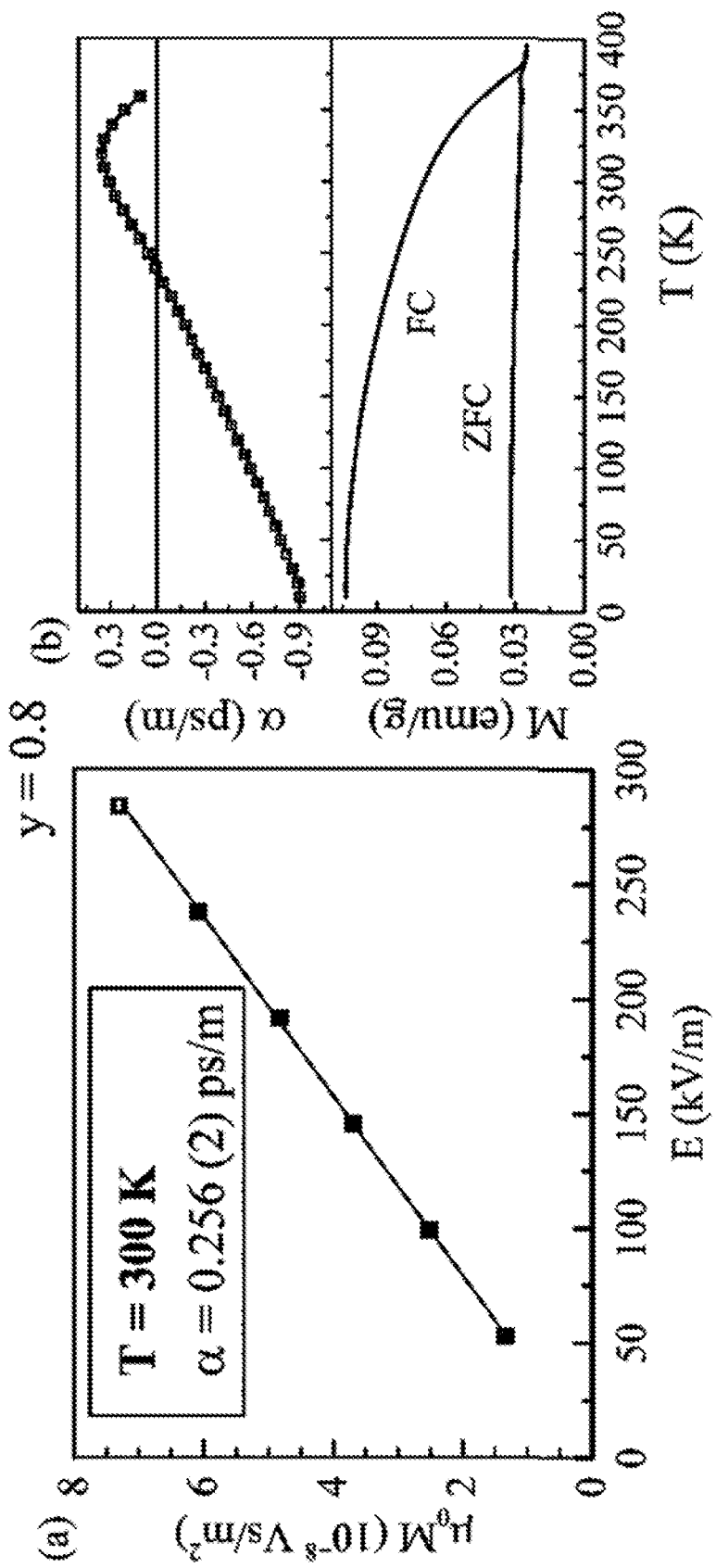
FIG. 5 shows (a) the linear ME effect in Example 4 at room temperature and (b) the variation of linear ME and magnetisation with T for Example 4 showing T$_N$=370 K FIG. 6 show (a) the dielectric permittivity (left axis) and loss (right axis) on Example 1 (black) and Example 4 (red), and (b) the P(E) loop on Example 4 showing ferroelectric switching at 473 K.

The room temperature linear ME coefficient ($\alpha$) is 0.26 ps/m as shown in FIG. 5(a).

Figure 6:
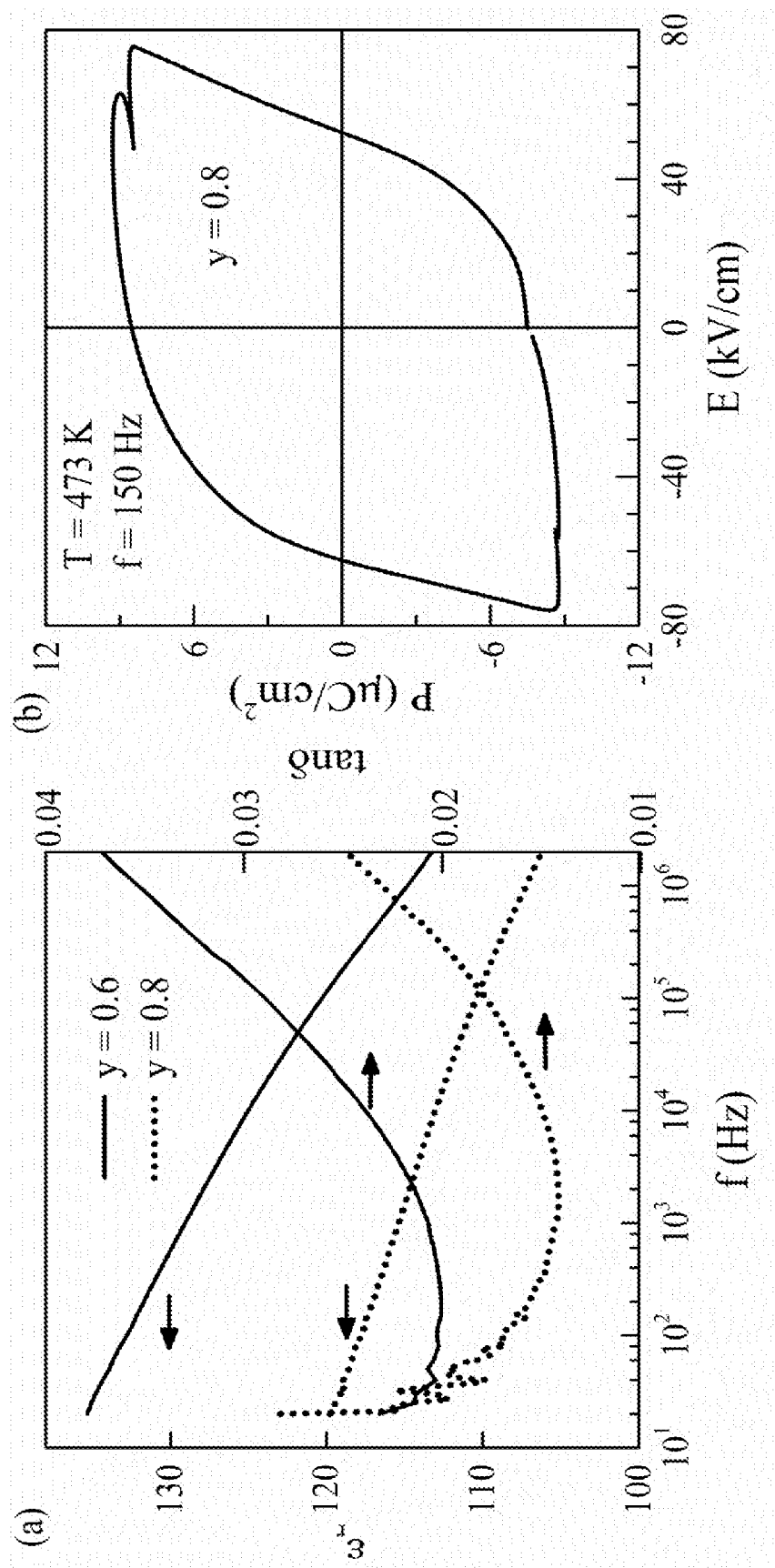

FIG. 6 shows (a) the dielectric permittivity (left axis) and loss (right axis) on Example 1 (black) and Example 4 (red), and (b) the P(E) loop on Example 4 showing ferroelectric switching at 473 K.

REFERENCES

1 Zhu, J.-G. Magnetoresistive Random Access Memory: The Path to Competitiveness and Scalability. *Proceedings of the IEEE* 96, 1786-1798, doi:10.1109/JPROC.2008.2004313 (2008).
2 Garcia, V. & Bibes, M. Electronics: Inside story of ferroelectric memories. *Nature* 483, 279-281 (2012).
3 Scott, J. F. & Paz de Araujo, C. A. Ferroelectric Memories. *Science* 246, 1400-1405 (1989).
4 Chappert, C., Fert, A. & Van Dau, F. N. The emergence of spin electronics in data storage. *Nat Mater* 6, 813-823 (2007).
5 Nan, T., Hui, Y., Rinaldi, M. & Sun, N. X. Self-Biased 215 MHz Magnetoelectric NEMS Resonator for Ultra-Sensitive DC Magnetic Field Detection. *Sci. Rep.* 3, doi: 10.1038/srep01985 (2013).
6 Zhai, J., Xing, Z., Dong, S., Li, J. & Viehland, D. Detection of pico-Tesla magnetic fields using magnetoelectric sensors at room temperature. *Applied Physics Letters* 88, 062510, doi:doi:http://dx.doi.org/10.1063/1.2172706 (2006).
7 Bibes, M. & Barthelemy, A. Multiferroics: Towards a magnetoelectric memory. *Nat Mater* 7, 425-426 (2008).
8 Kamenetskii, E. O., Sigalov, M. & Shavit, R. in *Electrical and Electronics Engineers in Israel, 2008. IEEEI 2008. IEEE 25th Convention of.* 599-603.
9 Hill, N. A. Why Are There so Few Magnetic Ferroelectrics? *The Journal of Physical Chemistry B* 104, 6694-6709 (2000).
10 Eerenstein, W., Mathur, N. D. & Scott, J. F. Multiferroic and magnetoelectric materials. *Nature* 442, 759-765 (2006).
11 Scott, J. F. Data storage: Multiferroic memories. *Nat Mater* 6, 256-257 (2007).
12 Scott, J. F. Room-temperature multiferroic magnetoelectrics. *NPG Asia Mater* 5, e72 (2013).
13 Manfred, F. Revival of the magnetoelectric effect. *Journal of Physics D: Applied Physics* 38, R123 (2005).
14 Rivera, J. P. A short review of the magnetoelectric effect and related experimental techniques on single phase (multi-) ferroics. *Eur. Phys. J. B* 71, 299-313, doi: 10.1140/epjb/e2009-00336-7 (2009).
15 Kita, E. et al. Low-temperature phase of yttrium iron garnet (YIG) and its first-order magnetoelectric effect. *Journal of Applied Physics* 64, 5659-5661, oi:doi:http://dx.doi.orci/10.1063/1.342262 (1988).
16 Rivera, J. P. & Schmid, H. Linear and quadratic magnetoelectric (ME) effect in Ni—Cl boracite. *Journal of Applied Physics* 70, 6410-6412, doi:doi:http://dx.doi.orci/10.1063/1.349911 (1991).
17 Ryu, J., Priya, S., Uchino, K. & Kim, H.-E. Magnetoelectric Effect in Composites of Magnetostrictive and Piezoelectric Materials. *Journal of Electroceramics* 8, 107-119, doi:10.1023/A:1020599728432 (2002).
18 Borisov, P., Hochstrat, A., Shvartsman, V. V. & Kleemann, W. Superconducting quantum interference device setup for magnetoelectric measurements. *Rev. Sci. Instrum.* 78, 106105, (2007).
19 Schmid, H. Some symmetry aspects of ferroics and single phase multiferroics. *J. Phys. Cond. Matter* 20, 434201 (2008).

The invention claimed is:

1. A single phase ceramic material comprising a morphotropic phase boundary and a continuous percolating network of magnetic cations; wherein the material has the composition shown in formula (I) below:

$$(1-x)LM^a{}_{(1-y)/2}Fe_yMg_{(1-y)/2}O_3 \cdot xQ \qquad (I)$$

wherein:
x is a value ranging from 0.01 to 0.4;
y is a value ranging from 0.01 to 0.9;
L is selected from Bi, La, Ce, Pr, Nd, Pm, Sm, Eu, Gd, Tb, Dy, Ho, Er, Tm, Yb, Lu or Y;
$M^a$ is selected from Ti, Hf or Zr; and
Q is:
a group of formula:

$$RM^bO_3$$

wherein:
R is selected from Ca, Sr or Ba; and
$M^b$ is selected from Ti or Hf or Zr; or
a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $PbZr_{1-p}Ti_pO_3$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
p is a value ranging from 0 to 1;
q is a value ranging from 0 to 1;
r is a value ranging from 0 to 1;
$M^c$ is selected from Mg, Ni, Cu, Mn, Co, Fe or Zn;
$M^d$ is selected from Fe, Mn, or Cr, and
$M^e$ and $M^f$ are independently selected from one or more of the following Zn, Ti, Sn, Mg, Nb, Ta, W, Li, Ni, Cu, Fe, Cr or Mn.

2. A single phase ceramic material according to claim 1, wherein the ceramic material comprising a morphotropic phase boundary is ferroelectric and the magnetic cations are present in an amount sufficient to impart ferromagnetic properties to the material.

3. A single phase material according to claim 1, wherein the material is multiferroic at a temperature between 243K and 473K.

4. A single phase ceramic material according to claim 1, wherein said material has the structure (Ia) shown below:

$$(1-x)BiM^a{}_{(1-y)/2}Fe_yMg_{(1-y)/2}O_3 \cdot xRM^bO_3 \qquad (Ia)$$

wherein:
x is between 0.01 and 0.4;
y is between 0.01 and 0.9;

R is selected from Ca or Sr; and $M^a$ and $M^b$ are each independently selected from Zr or Ti.

5. A single phase ceramic material according to claim 4, wherein:
i) $M^a$ is Ti; and/or
ii) $M^b$ is Ti; and/or
iii) R is Ca.

6. A single phase ceramic material according to claim 4, wherein:
i) x is between 0.05 and 0.20; and/or
ii) y is between 0.6 and 0.9.

7. A single phase ceramic material according to claim 4, wherein the single phase ceramic material is multiferroic at a temperature between 243K and 473K.

8. A single phase ceramic material comprising:
(i) a single phase ceramic material of formula I, wherein the material has the composition shown below:

$$(1-x)LM^a{}_{(1-y)/2}Fe_yMg_{(1-y)/2}O_3 \cdot xQ \qquad (I)$$

wherein:
x is a value ranging from 0.01 to 0.4;
y is a value ranging from 0.01 to 0.9;
L is selected from Bi, La, Ce, Pr, Nd, Pm, Sm, Eu, Gd, Tb, Dy, Ho, Er, Tm, Yb, Lu or Y;
$M^a$ is selected from Ti, Hf or Zr; and
Q is:
a) a group of formula:

$$RM^bO_3$$

wherein:
R is selected from Ca, Sr or Ba; and
$M^b$ is selected from Ti, Hf or Zr; or
b) a group selected from one or more of the following: $[BiM^dO_3]_q[Bi(M^e)_r(M^f)_{(1-r)}O_3]_{(1-q)}$, $CaZrO_3$, $SrZrO_3$, $BaZrO_3$, $KNbO_3$, $NaNbO_3$, $Ca_2FeNbO_6$, $PbZr_{1-p}Ti_pO_3$, $LnScO_3$, $LnGaO_3$ or $Ln_2TiM^cO_6$;
wherein:
Ln is selected from La, Ce, Pr, Nd, Pm, Sm, Eu, Gd, Tb, Dy, Ho, Er, Tm, Yb, Lu or Y;
p is a value ranging from 0 to 1;
q is a value ranging from 0 to 1;
r is a value ranging from 0 to 1;
$M^c$ is selected from Mg, Ni, Cu, Mn, Co, Fe or Zn;
$M^d$ is selected from Fe, Mn, or Cr; and
$M^e$ and $M^f$ are independently selected from one or more of the following Zn, Ti, Sn, Mg, Nb, Ta, W, Li, Ni, Cu, Fe, Cr or Mn; and
(ii) a further material, optionally selected from one or more of the following: $BiTi_{3/8}Fe_{2/8}Ni_{3/8}O_3$, $[BiM^dO_3]_q[Bi(M^e)_r(M^f)_{(1-r)}O_3]_{(1-q)}$, $Bi(M^e)_r(M^f)_{(1-r)}O_3$, $CaZrO_3$, $SrZrO_3$, $BaZrO_3$, $KNbO_3$, $NaNbO_3$, $Ca_2FeNbO_6$, $LnScO_3$, $LnGaO_3$ or $Ln_2TiM^cO_6$;
wherein
Ln is selected from La, Ce, Pr, Nd, Pm, Sm, Eu, Gd, Tb, Dy, Ho, Er, Tm, Yb, Lu or Y;
p is a value ranging from 0 to 1;
$M^c$ is selected from Mg, Ni, Cu or Zn;
$M^d$ is selected from Fe, Mn, or Cr; and
$M^e$ and $M^f$ are independently selected from one or more of the following Zn, Ti, Sn, Mg, Nb, Ta, W, Li, Ni, Cu, Fe, Cr or Mn.

9. A process for the preparation of a single phase ceramic material according to claim 1, wherein the single phase ceramic material comprises a morphotropic phase boundary and a continuous percolating network of magnetic cations, said process comprising sintering a material capable of forming a single phase ceramic material comprising a morphotropic phase boundary in the presence of a material capable of forming a continuous percolating network of magnetic cations within the morphotropic phase boundary of the ceramic material.

10. A process for forming a single phase ceramic material according to claim 8, comprising:
(i) combining and milling materials of the formulae A to E shown below:

| | |
|---|---|
| $L_2O_3$ | Formula A |
| $RCO_3$ | Formula B |
| $Fe_2O_3$ | Formula C |
| $M^aO_2$ | Formula D |
| $M^bO_2$ | Formula E | wherein L, R, $M^a$ and $M^b$ are as defined in claim 4;
with a material of the formula F:

| | |
|---|---|
| $MgCO_3 \cdot Mg(OH)_2 \cdot zH_2O$ | Formula F | wherein z is an integer between 0-5;
in the presence of a suitable organic solvent;
(ii) evaporating the organic solvent and pressing the resulting powder to form a pellet;
(iii) calcinating the pellet one or more times; and
(iv) optionally sintering the pellet in the presence of a binder and $MnO_2$.

11. A process according to claim 10, wherein:
i) the organic solvent in step (i) is ethanol; and/or
ii) the calcination of step (iii) is conducted at a temperature between 1190K and 1250K; and/or
iii) the binder of step (iv) is polyvinyl butyral.

12. A thin film formed from a single phase ceramic material according to claim 1.

13. A process of forming a thin film according to claim 12, the process comprising depositing a thin film of a single phase ceramic material on to a substrate.

14. A process of forming a thin film according to claim 13, wherein the process of depositing the thin film is selected from pulsed layer deposition (PLD), atomic layer deposition (ALD), chemical vapour deposition (CVD) or physical vapour deposition (PVD).

15. An electronic component comprising a single phase ceramic material according to claim 1.

16. An electronic component according to claim 15, wherein the electronic component is selected from a memory device, a tunnel junction, a magnetic field sensor, a transmitter, a receiver, a transmitter-receiver module, a phase array system or a resonator.

17. An electronic device comprising an electronic component according to claim 15.

18. An electronic device according to claim 17, wherein the electronic device is a tunable microwave device.

19. The electronic component according to claim 16, wherein the memory device is selected from MRAM, FERAM or MERAM.

* * * * *